(12) United States Patent
Helfman et al.

(10) Patent No.: US 10,180,440 B1
(45) Date of Patent: Jan. 15, 2019

(54) METHOD FOR AUTOMATING INSTRUMENT TESTS

(71) Applicant: Keysight Technologies, Inc., Minneapolis, MN (US)

(72) Inventors: Jonathan Helfman, Half Moon Bay, CA (US); Stanley T. Jefferson, Palo Alto, CA (US); Thomas R. Fay, Fort Collins, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 625 days.

(21) Appl. No.: 14/701,422

(22) Filed: Apr. 30, 2015

(51) Int. Cl.
*G01N 35/00* (2006.01)

(52) U.S. Cl.
CPC .............................. *G01N 35/00584* (2013.01)

(58) Field of Classification Search
CPC .................................................. G01N 35/00584
See application file for complete search history.

(56) References Cited

U.S. PATENT DOCUMENTS

| 6,810,494 | B2 | 10/2004 | Weinberg | |
|---|---|---|---|---|
| 7,921,381 | B2 * | 4/2011 | Petersen | G05B 23/0267 702/108 |
| 8,918,681 | B2 | 12/2014 | Korogi | |

* cited by examiner

*Primary Examiner* — Kyoung Lee

(57) ABSTRACT

A method of operating a data processing system to operate a first instrument and a second instrument connected to the data processing system is disclosed. The method includes displaying a measurement table. The data processing system receives user input defining a first parameter that is to be varied during a testing procedure by the first instrument and a first measurement to be made by the second instrument during the test procedure, a plurality of first parameter values to be used in the testing procedure. The data processing system causes the first instrument to provide each of the first parameter values and the second instrument to make the measurement and enter the measurement in a corresponding cell of a second row in the measurement table when the first instrument provides each of the first parameter values.

20 Claims, 6 Drawing Sheets

| Parameter or Action | Units | Trial | | | | | | | | | | |
|---|---|---|---|---|---|---|---|---|---|---|---|---|
| | | 1 | 2 | 3 | 4 | 5 | 6 | 7 | 8 | 9 | 10 | |
| Amplitude | mV | 100 | 100 | | | | | | | | | |
| Freq. | kHz | 10 | 15 | | | | | | | | | |
| Read Aver. | mVrms | 21.2 | 25.2 | | | | | | | | | |

| | Parameter or Step | Units | Measurement Trial | | | | | | | | | |
|---|---|---|---|---|---|---|---|---|---|---|---|---|
| | | | 1 | 2 | 3 | 4 | 5 | 6 | 7 | 8 | 9 | 10 |
| | Amplitude | mVrms | 200 | | | | | | | | | |

31

Parameter: Amplitude

Source: Amplitude // Function Generator // 33220A // 130.27.69.244

Delay: 0  Seconds before next step

33

35

| Bench App Recent Changes | |
|---|---|
| Sample Min: 9.39 mVrms | DMM |
| Sample Average: 9.40 mVrms | DMM |
| Sample Max: 9.42 mVrms | DMM |
| Sample Array | DMM |
| Range: 1 Vac | DMM |
| AC Filter: >200 Hz | DMM |
| Measurement: AC Voltage | DMM |
| Output: On | FG |
| Frequency: 3 kHz | FG |
| Amplitude: 200 mVrms | FG |

37

☐ Record

32

| Parameter and Steps | | |
|---|---|---|
| Bench App Recent Changes | | DMM |
| Sample Min. 9.39 mVrms | | DMM |
| Sample Average: 9.40 mVrms | | DMM |
| Sample Max: 9.42 mVrms | | DMM |
| Sample Array | | DMM |
| Range: 1 Vac | | DMM |
| AC Filter: >200 Hz | | DMM |
| Measurement: AC Voltage | | DMM |
| Output: On | | FG |
| Frequency: 3 kHz | | FG |
| Amplitude: 200 mVrms | | FG |

31

| Parameter or Step | Units | Measurement Trial | | | | | | | | | | Click here to sweep parameters over trials Summary |
|---|---|---|---|---|---|---|---|---|---|---|---|---|
| | | 1 | 2 | 3 | 4 | 5 | 6 | 7 | 8 | 9 | 10 | |
| Amplitude | mVrms | 100 | 100 | 100 | 100 | 100 | 200 | 200 | 200 | 200 | 200 | |
| Frequency | KHz | 3 | 4 | 5 | 6 | 7 | 3 | 4 | 5 | 6 | 7 | |
| Average | mVrms | | | | | | | | | | | |

38

41

Parameter: Sweeping

39

SWEEP  Amplitude ▶   Add Sweep   Delete Sweep
              FROM 100  TO 200  BY 100
SWEEP  Frequency ▶
              FROM 3    TO 7    BY 1

See the Data Table for a preview   UNDO

FIG. 5

METHOD FOR AUTOMATING INSTRUMENT TESTS

BACKGROUND

Testing systems test a device by varying one or more inputs to the device and measuring one or more outputs. As the number of combinations of inputs that need to be tested increases, such test systems can increasingly benefit from automation. The system or device is often referred to as the device under test (DUT). Modern test instruments include computer interfaces that allow the instrument to be run from a computer connected to the instrument over a network or other communication channel. With the appropriate drivers installed on the computer, the computer can control the outputs of signal sources used as the inputs to the DUT and can measure the signal leaving the DUT and store the results. User friendly interfaces allow the computer user to manipulate virtual instruments on the computer screen as if the user was manipulating the actual physical instrument.

For example an engineer might characterize the frequency response of a DUT by varying the frequency and amplitude of an input and measuring the amplitude of the corresponding outputs. External parameters such as temperature may also be varied. Hundreds or thousands of combinations of input parameters might need to be measured in a test. In the following discussion, each combination of input parameters will be referred to as a "measurement trial".

In addition to reducing the tedium of running large numbers of tests, automation also increases the reliability of the data by reducing human error. Manual testing requires the user to enter the parameters of each measurement trial. Such manual entry is error prone. In addition, the ability to repeat a series of measurement trials at a different time on the DUT is facilitated by scripts that define the measurement trials and can be reloaded at the time of the new tests.

Automated solutions require the use of a programming language to develop a software application. The engineer(s) working on characterizing the DUT may lack the programming skills needed to program the computer to acquire and analyze the data, particularly if some form of general programming language and program development platform is required.

SUMMARY

The present invention includes a method of operating a data processing system to operate a first instrument and a second instrument connected to the data processing system. The method includes displaying a measurement table that includes a plurality of rows and columns on a display connected to the data processing system. The data processing system receives user input defining a first parameter that is to be varied during a testing procedure by the first instrument, user input defining a first measurement to be made by the second instrument during the test procedure and user input defining a plurality of first parameter values to be used in the testing procedure, each of the first parameter values being entered into a corresponding cell in a first row of the measurement table. The data processing system causes the first instrument to provide each of the first parameter values and the second instrument to make the measurement and enter the measurement in a corresponding cell of a second row in the measurement table when the first instrument provides each of the first parameter values.

In one aspect of the invention, the data processing system provides a list of parameters that had been previously set for the first instrument, and the user input includes selecting a parameter from the list as the first parameter. In another aspect, the data processing system provides a GUI for controlling the first instrument interactively, and the list of parameters includes parameters that were previously controlled via the graphical user interface (GUI).

In a still further aspect, the data processing system provides a list of measurements that had been previously made for the second instrument, and the user input includes selecting a measurement from the list as the first measurement.

In another aspect, the data processing system provides a GUI for controlling the second instrument interactively, and the list of measurements includes measurements that were previously made via the GUI.

In a still further aspect, a plurality of columns in the measurement table are characterized by column labels, each row in those columns being characterized by a row value, and the method further includes displaying a graph of the row values as a function of the column labels. The graph can be displayed in a column on the row having the row values that are graphed. In one aspect, the graph is generated when one of the row values changes.

In another aspect, the method further includes causing the data processing system to fill in values in one of the rows using a formula that generates a sequence of values.

In a still further aspect, the data processing system receives user input to edit the measurement table.

BRIEF DESCRIPTION OF THE DRAWINGS

FIG. 2 illustrates an automation GUI according to one embodiment of the present invention.

FIG. 3 is a more detailed view of the GUI shown in FIG. 2.

FIG. 5 illustrates the use of a sweep operation to set parameters for various measurement trials.

DETAILED DESCRIPTION

The present invention is adapted for use with a virtual benchtop application such as Benchvue from Keysight Technologies, Inc.; however, the present invention can be used in any of a number of applications or as a standalone application. To simplify the following discussion, it will be assumed that the present invention is utilized in a virtual benchtop application.

In a virtual benchtop application, each attached instrument is typically represented by a GUI that resembles the front panel of the instrument or is organized in a manner that is analogous to such a front panel display. The GUI includes icons that can be manipulated and which control corresponding functions on the real instrument. The layout of the GUI is optimized for a user of the instrument who has little knowledge of software, such that the learning curve for operating instruments through the virtual benchtop application is minimal.

Figure 1:
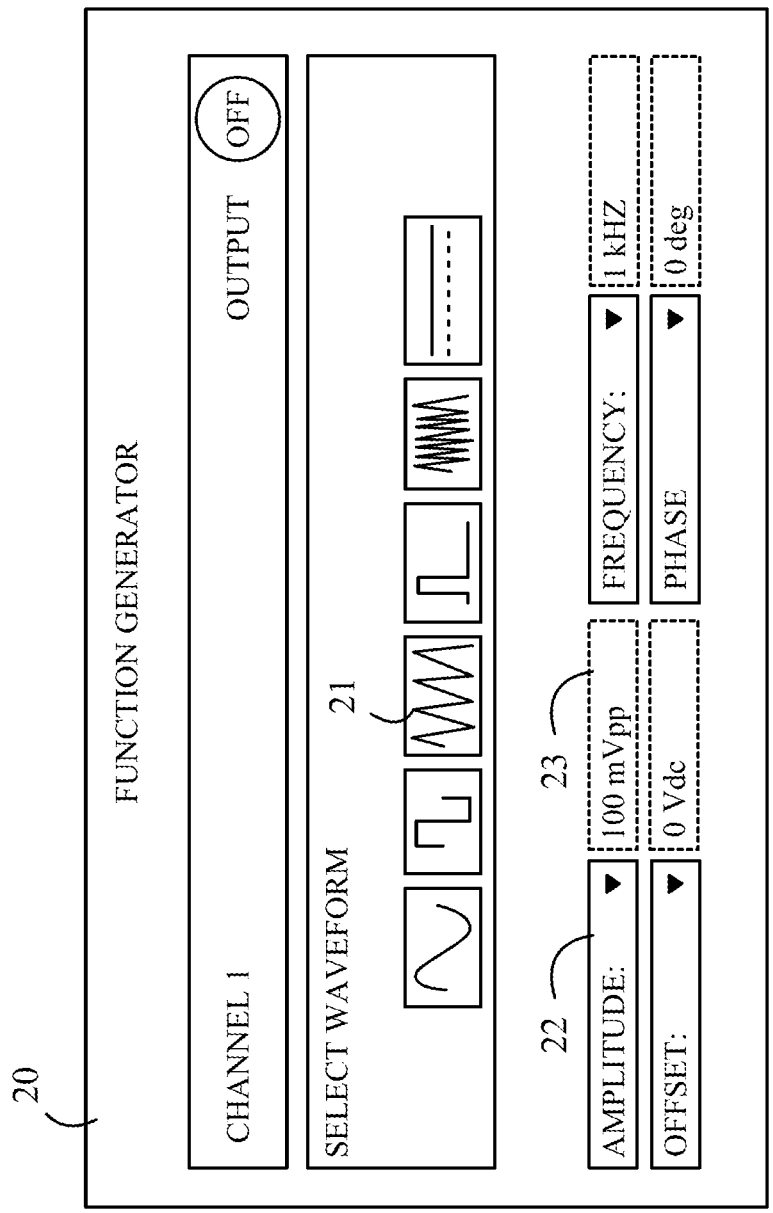
FIG. 1 illustrates a GUI for the function generator as might be provided in a virtual benchtop application.

Refer now to FIG. 1, which illustrates a GUI for the function generator as might be provided in a virtual benchtop application. GUI 20 has a general appearance that matches the appearance of the physical function generator that would be used by the experimenter. GUI 20 includes a plurality of virtual elements for controlling the instrument. For example, GUI 20 includes a plurality of "buttons" that set the waveform generated by the function generator. A typical waveform selection button is shown at 21. When the user "presses" this button by clicking on the button with a pointing device such as a mouse or touching the button on a touch screen enabled display screen, the corresponding function on the actual function generator is activated as if the user pushed a corresponding button on the physical instrument. Similarly, the user can set the amplitude of the output signal by typing a value into window 23 next to the amplitude control 22.

A typical device test requires the control of a number of instruments, each represented by its own GUI. For example, a DUT might be connected to a function generator such as that shown in FIG. 1 to provide the input signal to the DUT and a digital multi-meter (DMM) that reads one or more outputs from the DUT. In addition, the DUT may be connected to a power supply that has a third GUI and provides power to the DUT during the test. While the GUIs discussed above are well suited to controlling the test instruments during a single test, they are poorly adapted for running a large number of tests in an automated sequence.

An automated test can be viewed as a sequence of individual measurements in which each measurement consists of measuring one or more outputs from the DUT for a given set of inputs. Hence, the measurement can be divided into defining the instrument parameters that do not change over the tests, defining the test inputs, often referred to as test vectors, defining the sequence of instrument commands for making the indicated measurements, and storing the measurement results for that set of inputs. The final results are well matched to a tabular format. In addition, test engineers are used to providing the final test in a tabular format that is analogous to a spreadsheet. For example, the test results table could have rows for each input or output to the DUT and columns for each measurement trial.

In the present invention, a test is defined with the aid of an automation GUI and the test and results are organized around a table that makes use of the test engineers' familiarity with spreadsheets and the like. Refer now to FIG. 2, which illustrates an automation GUI according to one embodiment of the present invention. This simplified embodiment includes three regions. The first region is a table 33 for defining and storing the measurement trials. Each element of a test vector corresponds to a row in this table, and is defined in columns 34 and 35. The first parameter defines the quantity associated with that element of the test vector, and the second column provides the units in which the quantity is measured. In the example shown in FIG. 2, the first parameter of the test vector is specified as the amplitude of an input signal in mV, and the second parameter is the frequency of the signal in kHz. The remaining elements in that row are the values that these parameters are to assume in each of the trials. The manner in which these values are specified for a given test will be discussed in more detail below.

Columns 34 and 35 are also used to specify the measurement steps that are to be executed at each trial. In the example shown in FIG. 2, the measurement to be performed at each trial is a measurement of the rms voltage with a DMM that is under the control of the virtual benchtop application. Hence, in this example, the output signal from the frequency generator is set to 100 mV and a frequency of 10 KHz in the first trial. The automation system then measures the voltage on the DMM and fills in the result of 21.2 mV$_{rms}$ in the corresponding entry on the column for trial 1. The output of the frequency generator is then set to the values shown in trial column 2, and the output of the DMM measured again and entered into trial column 2.

In one aspect of the invention, the automation system facilitates the specification of the parameters and actions by utilizing lists of possible parameters and actions that are displayed in actions and parameters pallet 32. These lists will be referred to as the "parameter and action palette" in the following discussion. When the user sees an action or parameter in the list that matches the desired action, the user drags the action into column 34. Hence, the user does not require any knowledge of a syntax needed to correctly enter a parameter or action to populate column 34.

The list of actions and parameters has a number of sources. One source is a list of prior parameters or actions executed in the virtual benchtop application interactively by a user with respect to the instruments currently connected to the virtual benchtop application. This list will be referred to as the "history list" in the following discussion. When the history list is active, each time a user operates an instrument manually by interacting with an element on the GUI using the virtual benchtop application, the action is recorded in the history list. For example, if the user sets the frequency of the output of a function generator to 3 kHz, an entry specifying setting the particular function generator in question to have that output is recorded in the history list.

Refer now to FIG. 3, which is a more detailed view of the automation GUI shown in FIG. 2. The history list 37 is part of the actions and parameters pallet 32. These items are automatically recorded here when the user controls an instrument by interacting with the instrument through the virtual benchtop application. The items recorded here can be selected by the user and dragged and dropped into the parameter and actions columns 34 and 35. Hence, when the user changed the amplitude of the signal to 200 mV$_{rms}$, an entry was placed in the parameter and step column of the table 33 as indicated by the arrow in FIG. 3. The amplitude parameter is associated with the correct instrument and is now part of the automation scheme. The details of the parameter are shown in column 35 when the parameter is selected in the parameter and step column. It should be noted that the value for the parameter that was recorded in the history list is also entered into the first measurement trial. As will be explained in more detail, the values for the parameters can be edited later in the process to provide a desired value rather than one from the history list.

In addition, when "Record" is checked, the user's subsequent interactions with instruments are immediately entered in columns 34, 35, and Trial 1 of the next available row. This enables a sequence of interactions to be entered in the data table without having to drag and drop each interaction from the palette.

Figure 4:
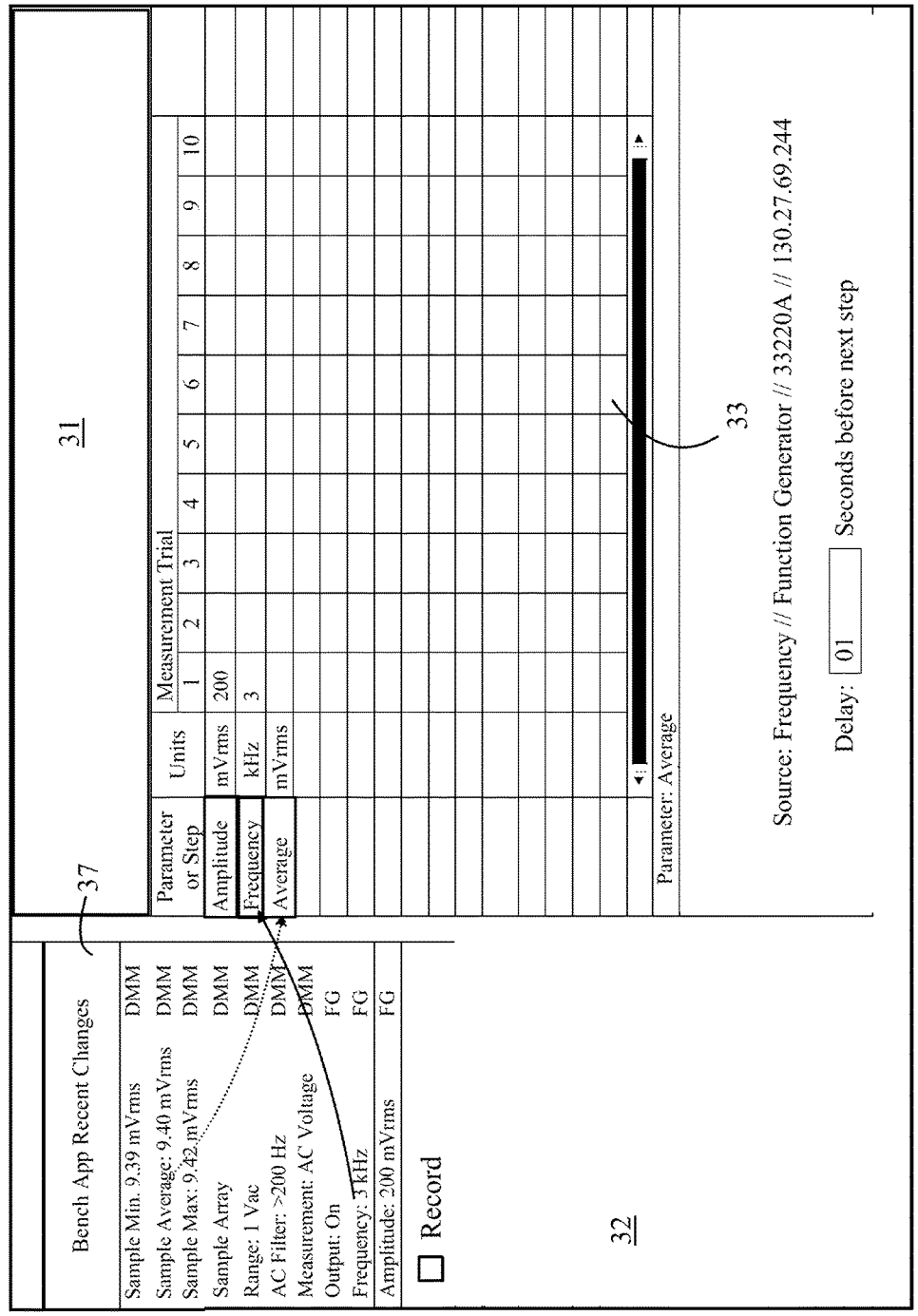
FIG. 4 illustrates the GUI after a frequency parameter and a measurement step have been added.

Additional parameters for a test can be moved to the measurement trial table from the history list in a similar manner. In addition, instructions requiring a measurement to be made from an instrument and the results stored in the measurement trial table can also be entered by dragging previous measurement instructions from the history list. Refer now to FIG. 4, which illustrates the automation GUI after a frequency parameter and a measurement step have been added. In this example, the DMM is used to measure an average output. In one aspect of the present invention, the automation GUI provides an automatic delay between setting parameters and making measurements that can be inserted between steps if needed.

Once the column defining the parameters and measurement steps is completed, the user must fill in the values of the parameters that are to be changed at each measurement trial. Various editing options are included in the tool bar shown at 31. In principle, the user could edit each entry manually to provide the required values; however, such a process is tedious and error prone.

In many cases of interest, the values assumed by the particular parameters can be expressed in terms of a simple rule such as providing a starting value, an increment size, and an ending value or number of steps. This process is analogous to a "Do" loop in a syntaxally based programming language. A sweep of a first parameter also allows another sweep of a second parameter to be embedded in the first sweep.

Refer now to FIG. 5, which illustrates the use of a sweep operation to set parameters for various measurement trials. The sweeping of parameters can be initiated by selecting a sweep option under an appropriate editing option, such as clicking in region 41, which brings up a sweep option window 39. The sweep option window allows the user to specify a parameter to be swept from the list of currently defined parameters, the starting and ending values of that parameter and the increment by which each parameter value is to be increased or decreased from measurement trial to measurement trial. To nest a second sweep within a first sweep, the second sweep is indented relative to the first sweep as shown in sweep option window 39. In a nested sweep, the parameter of the first sweep is held constant until all of the steps of the second parameter have been made.

For users who are not familiar with nested DO loops, the outcome of the sweep operation is not necessarily obvious. Hence, the present invention explicitly enters the values generated by the sweeping into the measurement trial table. This explicit representation of the nested loops will be referred to as an "unrolled" representation of the loop in the following discussion. The compact representation shown in sweep option window 39 will be referred to as the "rolled up" representation of the loop. The unrolled representation is provided as soon as the sweep values are specified in sweep option window 39 so that the user can verify that the rolled up representation is what the user had in mind. To further assist the user, a plot of the parameter values as a function of the measurement trial is provided in column 38. The plot is likewise generated as soon as the sweep values are defined, and hence, the user can verify that rolled up representation provided in sweep option window 39 is performing as anticipated.

While the rolled up representation discussed utilizes the equivalent of a DO loop in which successive values differ from one another by a constant amount, other rolled up representations could be utilized. In general, any formula that relates each successive measurements to the measurement trial number or column in the measurement table could be utilized.

In the above examples, the measurement trials are numbered sequentially. However, the trial numbers could be replaced by any unique label that could be used to refer to a given trial and to be used as the x-axis in the summary plots on the individual rows.

The user can edit the measurement table manually at any time. This facility is particularly useful after all of the parameter sweeps have been completed to provide refinements to the parameter values. For example, consider a test in which a DUT is known to have a resonance near a particular frequency. The measurement table can first be filled using relatively coarse frequency intervals. Then the user can insert additional columns near the resonance frequency to provide frequency intervals between those provided by the coarse sweep settings.

Similarly, the user can add rows to the measurement table to provide other measurements after an initial test has been done. The new rows could vary other parameters or specify other instrument measurements.

Figure 6:
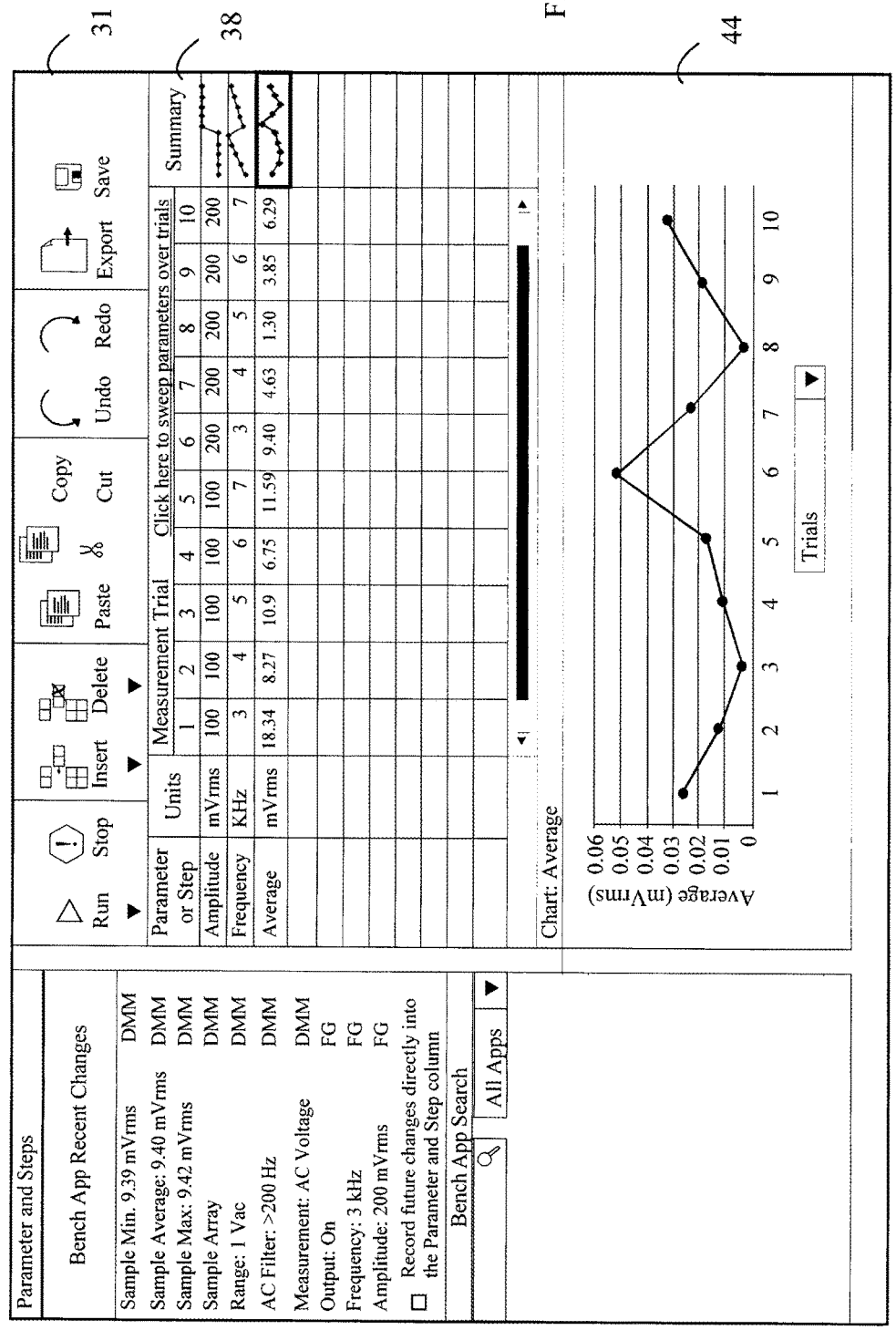
FIG. 6 illustrates the exemplary automation GUI after the tests specified in the measurement trial table have been run.

Refer now to FIG. 6, which illustrates the exemplary automation GUI after the tests specified in the measurement trial table have been run. The test execution is controlled by "Run" and "Stop" menu icons in menu 31. Menu 31 also includes the icons for manually editing the measurement trial table. The measurement trial table can also be exported to a spreadsheet program or saved for use in future tests as described above. The Summary column includes a graph of the entry in each line of the measurement trial table as a function of the trial number. Any particular summary line can be viewed in a chart window 44, which provides a higher resolution view of the summary.

In the above examples, the measurement table parameters and steps were provided from the individual actions recorded in the history list. However, the parameters and actions palette includes other menus for providing entries for initializing the measurement trial table. For example, a previously used measurement table that was saved can be accessed and used as the initial settings for a new measurement trial table. In addition, pre-packaged measurement tables for use in commonly performed tests can also be accessed for this purpose. Various instruments may also have software associated with the instrument that carries out a more complex measurement program that returns a measured value. Such programs can also be accessed from the parameters and action palette.

In the above examples, "columns" run vertically in the measurement table and "rows" run horizontally. However, embodiments in which columns run horizontally and rows run vertically can also be constructed. Accordingly, these labels are defined to cover both orientations. That is, rows could run vertically and columns could run horizontally in such a table.

The present invention can be practiced on any data processing system that is capable of being connected to the test instruments and has a display and user interface that can execute the above-described embodiments. Test instruments can be connected through any suitable communication channel. Examples of such channels include serial interfaces, parallel interfaces, and network interfaces.

The present invention also includes a computer readable medium that stores instructions that cause a data processing system to execute the method of the present invention. A computer readable medium is defined to be any medium that constitutes patentable subject matter under 35 U.S.C. 101 and excludes any medium that does not constitute patentable subject matter under 35 U.S.C. 101. Examples of patentable media include non-transitory media such as computer memory devices that store information in a format that is readable by a computer or data processing system.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method of operating a data processing system to operate a first instrument and a second instrument connected to said data processing system, said method comprising:
   displaying a measurement table comprising a plurality of rows and columns on a display connected to said data processing system;
   receiving user input defining a first parameter that is to be varied during a testing procedure by said first instrument;
   receiving user input defining a first measurement to be made by said second instrument during said testing procedure;
   receiving user input defining a plurality of first parameter values to be used in said testing procedure, each of said plurality of first parameter values being entered into a corresponding cell in a first row of said measurement table; and
   causing said first instrument to provide a plurality of first signals to a DUT, each of said plurality of first signals being determined by a corresponding one of said plurality of first parameter values, causing said second instrument to make a plurality of measurements of a second signal from said DUT, each of said plurality of measurements corresponding to one of said plurality of first parameter values, and entering each of said plurality of measurements in a corresponding cell of a second row in said measurement table.

2. The method of claim 1 wherein said data processing system provides a list of parameters that had been previously set for said first instrument, and wherein said user input comprises selecting a parameter from said list of parameters as said first parameter.

3. The method of claim 2 wherein said data processing system provides a GUI for controlling said first instrument interactively and wherein said list of parameters comprises parameters that were previously controlled via said GUI.

4. The method of claim 1 wherein said data processing system provides a list of measurements that had been previously made for said second instrument, and wherein said user input comprises selecting a measurement from said list of parameters as said first measurement.

5. The method of claim 4 wherein said data processing system provides a GUI for controlling said second instrument interactively and wherein said list of measurements comprises measurements that were previously made via said GUI.

6. The method of claim 1 wherein a plurality of columns in said measurement table are characterized by column labels, wherein each row in those columns is characterized by a row value, and wherein said method further comprises displaying a graph of said row values as a function of said column labels.

7. The method of claim 6 wherein said graph is displayed in a column on said row having said row values that are graphed.

8. The method of claim 6 wherein said graph is generated when one of said row values changes.

9. The method of claim 1 wherein said method further comprises causing said data processing system to fill in values in one of said rows using a formula that generates a sequence of values.

10. The method of claim 1 further causing said data processing system to edit said measurement table in response to user input.

11. A computer readable medium comprising instructions that cause a data processing system to execute a method for operating a display screen that is part of said data processing system, said method comprising:
   displaying a measurement table comprising a plurality of rows and columns on a display connected to said data processing system;
   receiving user input defining a first parameter that is to be varied during a testing procedure by said first instrument;
   receiving user input defining a first measurement to be made by said second instrument during said testing procedure;
   receiving user input defining a plurality of first parameter values to be used in said testing procedure, each of said first parameter values being entered into a corresponding cell in a first row of said measurement table; and
   causing said first instrument to provide a plurality of first signals to a DUT, each of said plurality of first signals being determined by a corresponding one of said plurality of first parameter values, causing said second instrument to make a plurality of measurements of a second signal from said DUT, each of said plurality of measurements corresponding to one of said plurality of first parameter values, and entering each of said plurality of measurements in a corresponding cell of a second row in said measurement table.

12. The computer readable medium of claim 11 wherein said data processing system provides a list of parameters that had been previously set for said first instrument, and wherein said user input comprises selecting a parameter from said list of parameters as said first parameter.

13. The computer readable medium of claim 12 wherein said data processing system provides a GUI for controlling said first instrument interactively and wherein said list of parameters comprises parameters that were previously controlled via said GUI.

14. The computer readable medium of claim 11 wherein said data processing system provides a list of measurements that had been previously made for said second instrument, and wherein said user input comprises selecting a measurement from said list of parameters as said first measurement.

15. The computer readable medium of claim 14 wherein said data processing system provides a GUI for controlling said second instrument interactively and wherein said list of measurements comprises measurements that were previously made via said GUI.

16. The computer readable medium of claim 11 wherein a plurality of columns in said measurement table are characterized by column labels, wherein each row in those columns is characterized by a row value, and wherein said method further comprises displaying a graph of said row values as a function of said column labels.

17. The computer readable medium of claim 16 wherein said graph is displayed in a column on said row having said row values that are graphed.

18. The computer readable medium of claim 16 wherein said graph is generated when one of said row values changes.

19. The computer readable medium of claim 11 wherein said method further comprises causing said data processing system to fill in values in one of said rows using a formula that generates a sequence of values.

20. The computer readable medium of claim 11 further causing said data processing system to edit said measurement table in response to user input.

* * * * *